United States Patent

Hickernell et al.

[11] 3,943,389
[45] Mar. 9, 1976

[54] TEMPERATURE STABILIZATION OF SURFACE ACOUSTIC WAVE SUBSTRATES

[75] Inventors: Fred S. Hickernell, Phoenix; Larry A. Moore, Scottsdale, both of Ariz.

[73] Assignee: Motorola, Inc., Chicago, Ill.

[22] Filed: July 2, 1974

[21] Appl. No.: 485,176

[52] U.S. Cl. ............... 310/9.5; 310/8.9; 310/9.7; 310/9.8; 310/8.1; 333/30 R
[51] Int. Cl.² ........................................ H01L 41/04
[58] Field of Search ............... 310/8.1, 9.7, 9.5, 9.8, 310/8.9; 333/30 R

[56] References Cited
UNITED STATES PATENTS

| | | | |
|---|---|---|---|
| 2,497,685 | 2/1950 | Gravley | 310/9.8 X |
| 3,187,207 | 6/1965 | Tomes | 310/8.7 |
| 3,349,259 | 10/1967 | Kistler | 310/8.4 X |
| 3,437,849 | 4/1969 | Treatch et al. | 310/8.9 |
| 3,464,033 | 8/1969 | Tournois | 333/30 R |
| 3,543,193 | 11/1970 | Fitch et al. | 333/30 R |
| 3,673,442 | 6/1972 | Sonderegger | 310/8.4 |
| 3,736,532 | 5/1973 | Armenakas | 333/30 R |
| 3,786,373 | 1/1974 | Schulz et al. | 333/30 R |

*Primary Examiner*—Mark O. Budd
*Attorney, Agent, or Firm*—Michael D. Bingham; Harry M. Weiss

[57] ABSTRACT

A surface acoustic wave (SAW) structure is disclosed wherein a SAW device is incorporated as an exterior lamina within a composite laminate in order to temperature stabilize the acoustic device. The composite laminate is synthesized to selectively mismatch the thermal expansion characteristics of the piezoelectric material, which is the body of the acoustic device, along the axis of acoustic propagation and simultaneously approximately match the thermal expansion properties along the orthogonal axis. Compressive force is thereby applied to the acoustic device to keep the substrate length constant and thus provide an approximately zero temperature coefficient over a preferred range of temperatures.

10 Claims, 4 Drawing Figures

U.S. Patent March 9, 1976 3,943,389
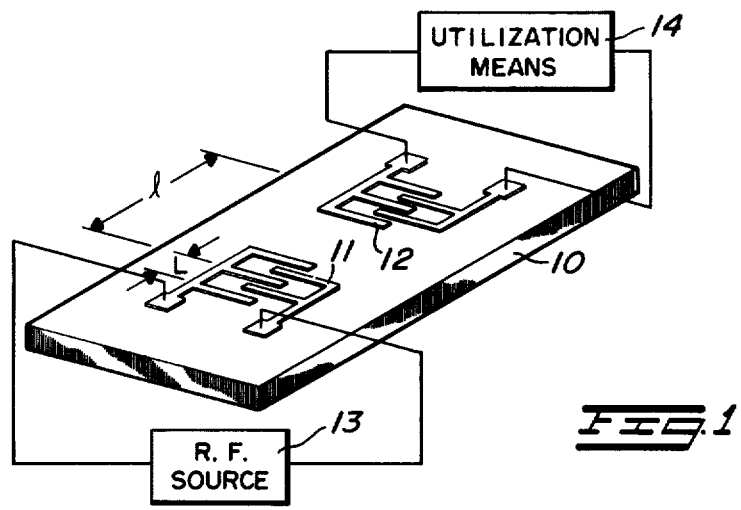
FIG. 1
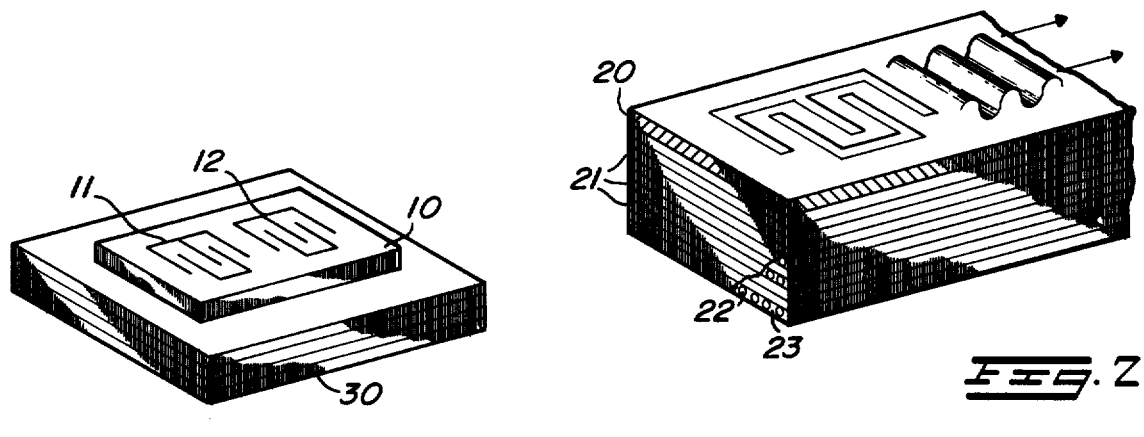
FIG. 3
FIG. 2
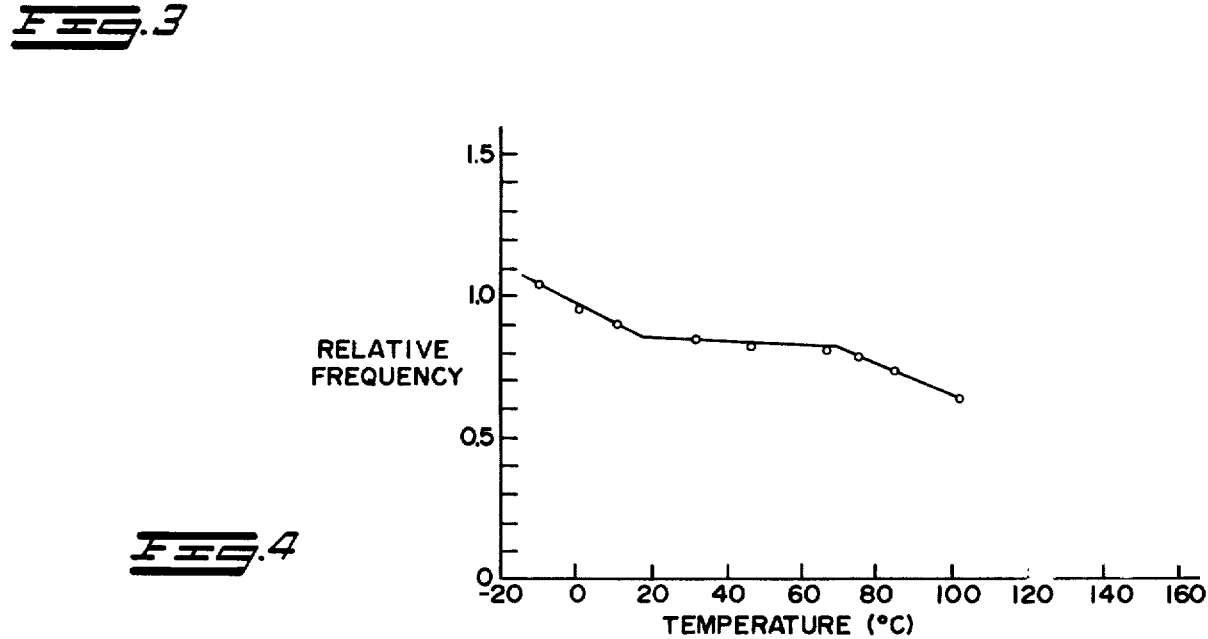
FIG. 4

TEMPERATURE STABILIZATION OF SURFACE ACOUSTIC WAVE SUBSTRATES

BACKGROUND OF THE INVENTION

Widespread interest now exists in surface acoustic wave (SAW) devices wherein the wave energy propagates along the surface of a material much as a ripple on a pond. In fact, if viewed microscopically, the surface of the material supporting these waves would resemble such a pond, complete with wave crests and valleys. One of the great advantages of SAW devices results from the fact that the surface waves travel at acoustic (sound) velocities which are much slower than electromagnetic wave propagation. A second equally important advantage is that the acoustic wave energy is continuously accessible along its propagation path. Because the wavelengths are shorter and the energy accessible, components such as delay lines, amplifiers, attenuators, filters and couplers of microminiature construction can be utilized to modify and process electronic signals.

In its simplest form a SAW circuit comprises a source of rf energy, a smooth slab-like element or substrate of material capable of supporting propagating surface waves and a utilization device. Electromechanical transducers are coupled to the substrate to convert the rf energy to surface waves in the material and vice versa. Thus configured, the basic surface wave device is primarily useful as a delay line. Frequently, it is desired to modify the propagating surface wave in a manner such as to enhance the operation of the basic devices and to form new devices having unique properties.

In general, piezoelectric materials are utilized in fabricating the surface wave substrate. With such substrates, the input and output transducers commonly take the form of arrays of thin film conductive interdigitated electrodes which are fabricated on the substrate surface. By properly designing the transducers, it is possible to obtain delay lines with desired characteristics of delay time and frequency response. Because of these properties, such devices are termed delay line filters, and find use in a broad range of communications and radar systems.

Because SAW devices usually have large time delays as compared to LC networks, the temperature coefficient of time delay becomes an important parameter. It is difficult to compensate for temperature effects with simple network techniques. In bandpass filter applications the center frequency, phase shift and time delay are temperature-dependent. In the case of matched filters used in chirp radars, range ambiguities are introduced due to a substrate temperature variation. In phase coded matched filters, the processing gain is seriously degraded as the temperature is varied.

The basic approach taken to date on compensating for delay time changes due to temperature on surface wave substrates has centered on a thin film composite material approach. This approach is characterized by the use of a thin film oxide layer on a surface wave substrate which permits the temperature coefficient of one material to compensate for the temperature coefficient of the other material. Control of the temperature coefficient of delay to small values has been achieved through the use of ZnO film layers on fused quartz and isopaustic glass. This layered film concept has been extended to ZnO film layers on other cuts of quartz and SiO₂ films on lithium niobate. Specific cuts of quartz and selected glasses have negative temperature coefficients while lithium niobate and zinc oxide possess positive coefficients.

Other approaches have included the butt-joint bonding of ST-quartz to LiNbO₃ and a resistive film heating arrangement using a phase-lock feedback loop. Placing the surface wave device in a temperature controlled oven is a direct but somewhat clumsy solution to the problem. It would be advantageous to identify a means of temperature compensation which is more simple.

To date, the approaches taken have met with only limited experimental success. It appears against basic structural properties of matter to simultaneously have a high coupling efficiency and low temperature coefficiency in a single material. The best condition obtainable would be that of inducing a temperature stable state in a material of high coupling efficiency and low propagation loss without degrading these properties. It would also be of tremendous benefit if the technique could be adapted to a variety of materials and would be fabricationally simple and reliable.

SUMMARY OF THE INVENTION

Accordingly, it is an object of this invention to provide a technique for making surface wave (SAW) devices that have temperature stable characteristics.

It is another object of this invention to provide the technique that is relatively inexpensive, reliable and fabricationally simple.

It is another object of this invention to provide the technique by means of applying compressive force to keep the SAW substrate length constant over the temperature range of interest.

It is still another object of this invention to provide a technique for making SAW devices that have high coupling efficiency, low propagation loss, and small temperature coefficient of time delay.

In accordance with the invention, the SAW device is made to have temperature stable characteristics. The surface wave device is incorporated as an exterior lamina in a composite laminate and defines a SAW structure. The composite laminate is synthesized in accordance with the particular thermal properties attributed to the type of piezoelectric material used as the acoustic device in order to temperature compensate the acoustic device. The composite laminate is composed of an array of composite laminae comprising unidirectional, high modulus, graphite fibers disposed in a heat resistant epoxy matrix. The number, orientation and position of the graphite laminae within the laminate cross section is established to selectively mismatch the thermal expansion characteristics of the acoustic device along the axis of acoustic propagation and simultaneously approximately match the thermal expansion properties along the orthogonal material property axis of the acoustic device.

Various other objects and advantages will appear from the following description of the preferred embodiments of the invention and the novel features will be particularly pointed out hereinafter in connection with the appended claims.

BRIEF DESCRIPTION OF THE DRAWINGS

FIG. 1 is a simplified pictorial view of a surface acoustic wave (SAW) delay line filter.

FIG. 2 is an illustration of a structure for offsetting the temperature effect on a SAW device by means of the compressive force induced by a graphite composite laminate to which the substrate of the device is bonded.

FIG. 3 is a pictorial view of the FIG. 2 structure wherein the delay line filter of FIG. 1 is the SAW device.

FIG. 4 is a graph of the center frequency of the delay line filter of FIG. 1 as a function of temperature.

DETAILED DESCRIPTION OF THE PREFERRED EMBODIMENTS

Referring more specifically to the drawings, FIG. 1 is a simplified pictorial view of a surface acoustic wave (SAW) delay line filter. In FIG. 1, a substrate 10 of piezoelectric material is provided with an input transducer 11 and an output transducer 12. A source of rf energy indicated generally by block 13 is electrically coupled to input transducer 11. Source 13 can also include suitable electromagnetic tuning elements as are well known in the art. A utilization circuit indicated generally as block 14 is, in turn, electrically coupled to the output transducer 12. The piezoelectric material from which substrate 10 is fabricated is of the type suitable for the propagation of acoustic surface waves. Many suitable materials have been employed for this purpose and their characteristics can be found in the recent technical literature. New materials like lithium niobate and bismuth germanium oxide have been found to combine strong piezoelectric coupling with low acoustic propagation loss and large time delay per unit length. Crystalline quartz, which has become so widely used in bulk acoustic wave devices, is also important for SAW devices because new orientations of this material have been found which have very low temperature coefficients of time delay. The most popular materials are quartz, because of its low cost and temperature stability and lithium niobate, because of its high piezoelectric coupling.

Generally, the surface of substrate 10 is ground and polished to an optical quality finish in order to reduce surface imperfections to a minimum. Input and output transducers 11 and 12 are deposited, bonded or otherwise mechanically attached to the upper polished surface of substrate 10. Transducers 11 and 12 can be formed of any suitable electrically conductive material such as aluminum or gold. The thickness of the deposited conductive material comprising the transducers is not critical and can typically be on the order of 500 to 1,000 Angstroms or more.

As shown in FIG. 1, each transducer consists of a number of interleaved metal electrodes. In the simplest case, the width and spacing of these electrodes is equal and is uniform throughout the transducer pattern. When a harmonic voltage is applied to the transducer terminals, the transducer pattern excites a periodic electric field which penetrates into the piezoelectric substrate. The substrate responds by periodically expanding and contracting in unison with these fields. With the proper choice of substrate orientation, which in the present invention is of the Y-cut and Z propagating direction, this piezoelectric excitation gives rise to SAWs which propagate in the two directions normal to the transducer electrodes.

As might be expected by analogy with bulk acoustic wave devices, the peak SAW output from the transducer occurs near the center frequency $f_o$, defined by the SAW velocity ($v$) and the periodic length (L) of the transducer pattern, as:

$$f_o = v/L \tag{A}$$

The time delay, or time ($\tau$) for the surface acoustic wave to travel the distance ($l$) between transducers is:

$$\tau = l/v \tag{B}$$

As mentioned above, there are two principle materials that find application as acoustic surface wave substrates. Lithium niobate ($LiNbO_3$) has the highest coupling coefficient, but a large linear temperature coefficient of delay (i.e., 94 ppm/°C.). This temperature coefficient is too large for many practical applications. The second material is ST-quartz which has a zero first order temperature coefficient of delay. However, its coupling efficiency is approximately 30 times lower than that of $LiNbO_3$. Thus the insertion loss becomes a problem in applications requiring a large fractional bandwidth. Furthermore, the surface wave attenuation coefficient of ST-quartz is larger than 2dB/$\mu$s at 1 GHz and its second order temperature coefficient exhibits a parabolic dependence with temperature coefficients greater than 30 ppm/°C. at temperatures of 35°C. away from room temperature.

Ideally one would like a material having the strong coupling and low propagation loss of $LiNbO_3$ and the small temperature coefficient of ST-quartz. A technique for accomplishing this, which utilizes $LiNbO_3$ in conjunction with a temperature compensating material, is described below.

As the temperature of a $LiNbO_3$ substrate increases, $l$ in equation (B) increases and $v$ in equation (B) decreases; therefore, the delay time, $\tau$, increases as a result of each of the two effects. Applying compressive force along the longitudinal axis of the substrate causes $l$ to decrease and $v$ to increase and thus will compensate for the effects of temperature increase on delay time.

Also, as the temperature of the substrate increases, L in equation (A) increases and $v$ decreases; therefore, $f_o$ decreases as a result of each of these two effects. Again, applying compressive force along the longitudinal axis of the substrate causes L to decrease and $v$ to increase and thus will compensate for the effects of temperature on $f_o$.

By rigidly bonding a $LiNbO_3$ substrate 20 to a composite laminate 21 of unidirectional, high modulus fibers 22 imbedded in a heat resistant epox matrix 23, as illustrated by FIG. 2 and described in more detail below, compressive force as described above is created on the substrate, said force increasing as temperature increases. Thus, a means of compensating for temperature effects on delay time and filter center frequency can be obtained. The theory for this temperature compensation means is discussed briefly below.

The temperature dependence of elastic acoustic wave propagation in a solid is characterized by its temperature coefficient of time delay. Considering the time delay, $\tau$, path length, $l$, divided by a velocity $v$, $$\tau = l/v, \tag{1}$$

the first order temperature coefficient of delay is given by $$\frac{1}{\tau}\frac{\delta\tau}{\delta T} = \frac{1}{l}\frac{\delta l}{\delta T} - \frac{1}{v}\frac{\delta v}{\delta T} \tag{2}$$

where T is the temperature. The fractional change in length with temperature $\delta(\ln l)/\delta T$ is the thermal expansion coefficient, $\alpha$. The thermal expansion coefficient is normally positive (increasing length with increasing temperature) and for most materials is on the order of $10^{-5}/°C$. The temperature coefficient of velocity is generally a negative quantity (velocity decreases as temperature increases) and its magnitude is on the order of $10^{-4}/°C$. The net effect can be a fairly substantial value for the temperature coefficient of delay. For example, in YZ lithium niobate the thermal expansion coefficient is 8 ppm/°C and the temperature coefficient of velocity is −86 ppm/°C. This gives a substantial positive value of temperature coefficient of delay of 94 ppm/°C.

In general, an acoustic velocity is equal to the square root of an appropriate elastic constant, $c$, divided by density, $\rho$, $$v = \sqrt{c/\rho} \qquad (3)$$

Thus the temperature coefficient of velocity can be given by $$\frac{1}{v}\frac{\delta v}{\delta T} = \frac{1}{2c}\frac{\delta c}{\delta T} - \frac{1}{2\rho}\frac{\delta \rho}{\delta T} \qquad (4)$$

The temperature change of density is directly related to thermal expansion coefficient and, for example, in the case of an isotropic material $$\frac{1}{\rho}\frac{\delta \rho}{\delta T} = -3\alpha \qquad (5)$$

Using this expression together with equations (2) and (4), the temperature coefficient of time delay becomes in a very simplified form.

$$\frac{1}{\tau}\frac{\delta \tau}{\delta T} = \frac{1}{2}\left(\alpha + \frac{1}{c}\frac{\delta c}{\delta T}\right) \qquad (6)$$

R. E. Newnham, ("Elastic Properties of Oxides and the Search for Temperature Compensated Materials", Air Force Cambridge Research Laboratories Scientific Report, AFCRL-TR-73-0220, Mar. 30, 1973), has developed a simple classical mechanical analog in which springs represent atomic bonds in order to represent the change in elastic constant in terms of basic mechanical parameters.

In a mechanical spring model assuming isotropic identical springs the elastic coefficient will be directly proportional to force constant, $k$, and inversely proportional to bond length, $l$, $$c \cong k/l \qquad (7)$$

If we take the approximate expression given by (7) and calculate the temperature change of $c$, $$\frac{\delta c}{\delta T} \cong \frac{\delta}{\delta T}\left(\frac{k}{l}\right) \cong \frac{1}{l}\frac{\delta k}{\delta T} \cong \frac{k}{l^2}\frac{\delta l}{\delta T}, \qquad (8)$$

$$\frac{\delta c}{\delta T} \cong \frac{1}{l}\frac{\delta k}{\delta l}\frac{\delta l}{\delta T} - \frac{1}{l}\left(\frac{k}{l}\right)\frac{\delta l}{\delta T}, \qquad (9)$$

$$\frac{\delta c}{\delta T} \cong \alpha \left(\frac{\delta k}{\delta l} - \frac{k}{l}\right) \qquad (10)$$

where we have used the fact the change in $k$ depends primarily upon bond length. Substituting this expression into equation (6)

$$\frac{1}{\tau}\frac{\delta \tau}{\delta T} \cong -\frac{\alpha}{2}\left[1 + \frac{1}{c}\left(\frac{\delta k}{\delta l} - \frac{k}{l}\right)\right] \qquad (11)$$

and with a final simplification substitution for $c$, $$\frac{1}{\tau}\frac{\delta \tau}{\delta T} \cong -\frac{\alpha}{2}\left(\frac{l}{k}\frac{\delta k}{\delta l}\right) \qquad (12)$$

Substitution of values typical for quartz gives a $\delta \ln \tau /\delta T$ value equal to 30 ppm/°C.

The simple spring force constant model gives the right order of magnitude value that is observed experimentally. In practice the actual crystal structure is considerably more complicated and the spring constant model cannot be used to accurately predict the temperature coefficient of delay. It does serve to place in focus those physical characteristics which dominate the change in time delay with temperature. From expression (11) it is apparent that the temperature coefficient of time delay is directly proportional to thermal expansion coefficient and the parameters relating fractional changes of bond length and spring constant.

The conclusion to be drawn is that the temperature coefficient of delay will become zero if the change in bond length with temperature is zero. It is this approach which is used for stabilizing the temperature coefficient to a zero value.

Composite structures have been used for some time to compensate for undesirable property changes which can occur in a single material.

The word composite implies that two or more materials are utilized as macroscopic components to form a composite material which has a desired set of physical characteristics. Composites may be formulated and used to advantage in lieu of conventional materials in many applications since they usually exhibit the best qualities of their constituents plus some qualities that no single constituent possesses alone. Unique properties may be tailored to fit specific requirements of a particular application by varying constituent material types, quantity, orientation and geometry. Apparent (macroscopic) properties of a specific composite and interaction of its constituents may be reliably predicted on the basis of known constituent material characteristics, the principles of solid mechanics, and composite theory.

For temperature compensating acoustic devices it is seen, that to first order, if the material is prevented from expanding, a temperature coefficient of time delay near zero can be obtained. This would be a structure which physically restricts expansion. For example, if the surface wave substrate is bonded to a material whose properties prevent expansion at the surface through induced stress changes, this should produce the desired zero temperature coefficient. The selection of the material to which the substrate is bonded and the bonding material are critical items.

One approach taken is the use of a graphite laminate composite whose properties may be tailored to achieve the desired stress levels. An illustration of such a structure is shown in FIG. 2. The structure incorporates a surface wave substrate 20 as an exterior lamina in a laminated composite plate element. The balance of the laminate consists of composite laminae 21 comprised of unidirectional, high modulus, graphite fibers 22 embedded in a heat resistant epoxy matrix 23. The number, type, orientation, and geometric array of the composite laminae is a function of the substrate crystal type, thickness, and orientation (cut) which is to be temperature compensated. The laminate is tailored to selectively match or mismatch material properties of the surface wave substrate lamina and thereby induce controlled stress levels in the device when the laminate is exposed to variations in thermal environment. In this manner, properties of the laminate are exploited to compensate undesirable thermally induced expansion and material property variations at the surface of the substrate.

The design of the laminate is based upon composite plate theory as taught by J. E. Ashton, et al, *Primer on Composite Materials: Analysis*, Technomic Publishing Co., Stanford, Connecticut, 1969. The theory is applicable to a laminate formed from an arbitrary number and array of anisotropic laminae. An internal compressive stress is developed along a selected material axis of the surface wave lamina by designing in a selective mismatch between its thermal expansion characteristics and those of the balance of the laminate. Simultaneously, it is necessary to tailor the composite such that off-axis stress levels in the lithium niobate are maintained within acceptable levels.

Composite laminae in the form of a thin tape prepreg can be used. For instance, NARMCO 5208T-300 carbon prepreg, made by NARMCO Materials Division, Whittaker Corporation, is a modified epoxy resin reinforced with unidirectional Thornal 300 carbon fibers and is supplied as a tape approximately 0.007 inches thick. The laminate is formed from a lay-up of several layers of this tape. Individual lamina are placed in the lay-up such that their principal material axes are oriented at a prescribed angle with the principal axes of the laminate. Laminae number, orientation, and position are formulated according to the net material properties required for the laminate. After lay-up the laminate is cured at elevated temperature and under moderate pressure.

After completion of the initial composite laminate, the final laminate is formed by bonding the surface wave crystal in its prescribed position and orientation.

The results of an application of this technique will now be described. The LiNbO₃ substrate filter embodiment of FIG. 1 comprised of substrate 10 and transducers 11 and 12 is bonded to a 15 layer graphite composite laminate 30 as described above and as shown by FIG. 3 in simplified form. The frequency vs. temperature characteristic of the filter is shown by the graph of FIG. 4. As indicated, the frequency remains nearly constant over the temperature range of 20°C. to 70°C., corresponding to a temperature coefficient of less than 10 ppm/°C.

The temperature range and its central value for nearly zero temperature coefficient can be regulated in various ways, such as: by changing the composite laminate structure and orientation angle of the graphite fibers; by changing the bonding materials and temperature at which bonding takes place.

This temperature compensation technique is also applicable to other surface acoustic wave substrate materials and to other composite laminate structures and materials. Other methods can also be used to apply compressive force to keep the substrate length constant and thus provide a nearly zero temperature coefficient over the temperature range of interest.

The above-described temperature stabilization techniques are also applicable to all other SAW devices in addition to the delay line filter of the preferred embodiment.

One of the major concerns in the industry today pertaining to SAW devices is a relatively simple, reliable and inexpensive means of maintaining high coupling efficiency low propagation loss, and a small temperature coefficient of delay. This invention will provide such means and will enable a substantial increase in the use of SAW devices in military, space and commercial equipment.

We claim:

1. A temperature compensated surface acoustic wave structure including a surface acoustic wave device comprising a body of piezoelectric material having a first planar surface on which surface waves are generated and a second planar surface, said temperature compensated surface acoustic wave structure comprising in combination:
   a composite laminate substrate composed of an array of laminae;
   said composite laminate substrate being laminated to the second surface of the surface acoustic wave device with the surface acoustic wave device forming an exterior lamina of a composite laminate;
   said substrate having a thermal expansion coefficient selectedly mismatched to the thermal expansion coefficient of the surface acoustic wave device along the axis of acoustic propagation for inducing controlled stress changes with temperature at the surface of the device;
   said substrate having a thermal expansion coefficient substantially matched to the thermal expansion characteristics of the device along the orthogonal material property axis of the device; and
   said induced controlled stress changes along the axis of acoustic propagation causing the temperature coefficient of delay of the surface wave device to be essentially zero over a predetermined temperature range.

2. The temperature compensated surface acoustic wave structure of Claim 1 wherein:
   said substrate being comprised of an array of composite lamina comprising unidirectional, high modulus graphite fibers disposed in a heat resistant epoxy matrix; and
   the number, orientation, and position of said graphite lamina within the laminate cross section of said substrate is predetermined to selectively mismatch the thermal expansion characteristics of the surface acoustic wave device along the axis of acoustic propagation and simultaneously match the thermal expansion properties of the surface acoustic wave device along the orthogonal material property axis.

3. The temperature compensated surface acoustic wave structure of claim 2 wherein:
   approximately 65 percent of said substrate's volume is comprised of said graphite fibers; and
   said substrate is comprised of 15 laminae.

4. In combination with a surface wave device including a Y-cut, Z-propagating lithium niobate piezoelectric crystal having a first and second planar surface and at least two transducers for respectively exciting and receiving surface waves on the first surface of the surface wave device, a structure for providing temperature stabilization of the surface wave device, the improvement comprising:

a composite laminate substrate having predetermined material properties for inducing controlled stresses to selectively match and mismatch thermal expansion characteristics of the piezoelectric crystal to thereby establish temperature stabilization of said piezoelectric crystal, said composite laminate structure being bonded to the second surface of the surface wave device such that the excited surface waves are not transmitted therethrough, said composite laminate structure including graphite fibers disposed in a heat resistant epoxy matrix with said graphite fibers being disposed unidirectionally in each lamina.

5. The temperature stable surface acoustic wave structure of claim 4 wherein said composite laminate structure comprises in combination:

graphite fibers disposed in a heat resistant epoxy matrix; and said graphite fibers being disposed unidirectionally in each lamina.

6. The temperature stable surface acoustic wave structure of claim 4 wherein:

said substrate is composed of 15 laminae; and said graphite fibers are disposed in each of said 15 laminae at a predetermined orientation with respect to the axis of propagation of the surface acoustic wave.

7. The temperature stable surface acoustic wave structure of claim 4 wherein said substrate is comprised of graphite fibers in the ratio of approximately 65 percent with respect to the total volume of said substrate.

8. In combination with a surface wave device including a Y-cut, Z-propagating lithium niobate piezoelectric crystal having a first and second planar surface and at least two transducers for respectively exciting and receiving surface waves on the first surface of the surface wave device, a structure for providing temperature stabilization of the surface wave device, the improvement comprising:

graphite fibers disposed in a heat resistant epoxy matrix;

said graphite fibers being disposed unidirectionally in each lamina;

said substrate is composed of 15 laminae;

said graphite fibers are disposed in each of said 15 laminae at a predetermined orientation with respect to the axis of propagation of the surface acoustic wave; and said substrate is comprised of graphite fibers in a ratio of approximately 65 percent with respect to the total volume of said substrate.

9. A temperature stable surface wave structure comprising:

a body of piezoelectric material having first and second opposing planar surfaces;

excitation means for exciting surface waves on said first planar surface of said body of said piezoelectric material in response to electromagnetic signals being supplied thereto;

a composite laminate structure having predetermined material properties for providing temperature compensation of said piezoelectric material by inducing controlled stress changes in said piezoelectric material thereby establishing the temperature stable surface wave structure, said composite laminate structure being bonded to said second surface of said piezoelectric material said composite laminate substrate induces said controlled stresses along said axis of propagation of said surface waves to selectively mismatch the thermal expansion coefficient of said piezoelectric material; and said composite laminate substrate induces controlled stress to substantially match the thermal expansion characteristics of the piezoelectric material along the orthogonal axis to said axis of propagation of said excited surface waves.

10. The temperature stable structure of claim 9 wherein:

said composite laminate structure comprises a plurality of individual lamina layers, each layer having graphite fibers unidirectionally disposed in an epoxy matrix; and said graphite fibers of said individual lamina layers being at a predetermined orientation to the axis of propagation of said excited surface waves to selectively match and mismatch thermal expansion characteristics of said piezoelectric material by inducing said controlled stresses.

* * * * *